United States Patent [19]

Sloan

[11] Patent Number: 5,130,659
[45] Date of Patent: Jul. 14, 1992

[54] BATTERY MONITOR

[76] Inventor: Jeffrey M. Sloan, 312 George St., Birmingham, Mich. 48009

[21] Appl. No.: 620,741

[22] Filed: Dec. 3, 1990

Related U.S. Application Data

[63] Continuation-in-part of Ser. No. 570,383, Aug. 21, 1990, abandoned.

[51] Int. Cl.$^5$ .............................................. G01N 27/46
[52] U.S. Cl. .................................... 324/435; 324/426; 324/427; 320/48; 340/636
[58] Field of Search ................. 320/13, 48; 340/636; 324/426, 427, 428, 435

[56] References Cited

U.S. PATENT DOCUMENTS

| | | |
|---|---|---|
| 3,127,518 | 3/1964 | Pruitt . |
| 3,172,400 | 3/1965 | Hale . |
| 3,395,288 | 7/1968 | von Brimer . |
| 3,497,707 | 2/1970 | Stewart . |
| 3,646,354 | 2/1972 | von Brimer . |
| 3,668,154 | 6/1972 | Peck . |
| 3,763,415 | 10/1973 | Ownby . |
| 3,829,753 | 8/1974 | Marshall . |
| 3,852,732 | 12/1974 | Yorksie et al. . |
| 3,967,133 | 6/1976 | Bokern . |
| 4,090,122 | 5/1978 | Hoinski . |
| 4,127,782 | 11/1978 | Omura et al. . |
| 4,149,093 | 4/1979 | D'Allesio et al. . |
| 4,153,869 | 5/1979 | Ragaly . |
| 4,161,684 | 7/1979 | Ragaly . |
| 4,258,305 | 3/1981 | Anglin . |
| 4,282,475 | 8/1981 | Milton . |
| 4,493,001 | 1/1985 | Sheldrake . |
| 4,509,005 | 4/1985 | Stroud . |
| 4,516,066 | 5/1985 | Nowakowski . |
| 4,678,998 | 7/1987 | Muramatsu ................. 324/427 |
| 4,902,956 | 2/1990 | Sloan . |

Primary Examiner—Walter E. Snow
Assistant Examiner—Jose M. Solis
Attorney, Agent, or Firm—Gifford, Groh, Sprinkle, Patmore & Anderson

[57] ABSTRACT

A battery monitor is disclosed for indicating the projected time until the battery reaches a lower threshold value indicative of the energy capacity of the battery. The battery monitor includes a microprocessor which iteratively reads the value of the battery voltage. The microprocessor then determines the rate of discharge of the battery and projects the future values of the battery voltage as well as the projected time at which the battery voltage attains the threshold voltage. This projected time is then displayed on a visual indicator, such as an LCD display. In an alternate embodiment, warning lights are selectively illuminated to indicate a full charge, medium charge and low charge conditions.

21 Claims, 3 Drawing Sheets

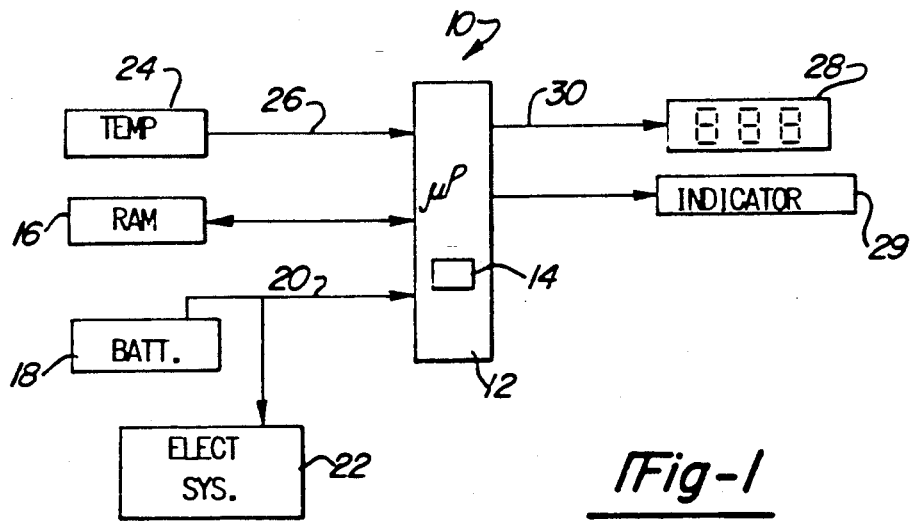
_Fig-1_
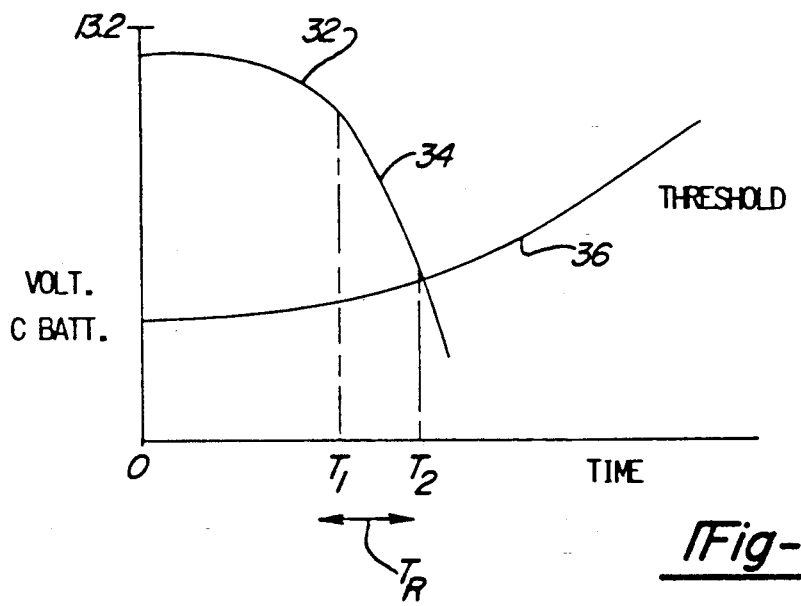
_Fig-2_
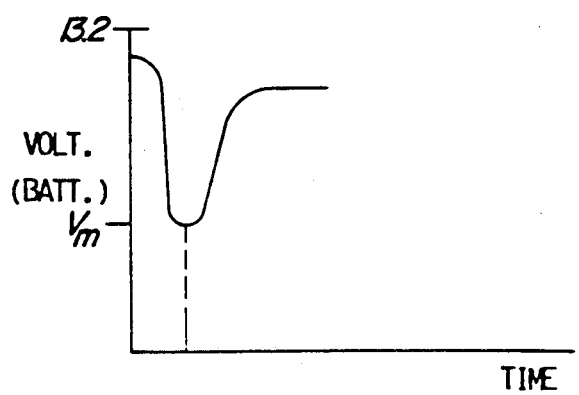
_Fig-3_

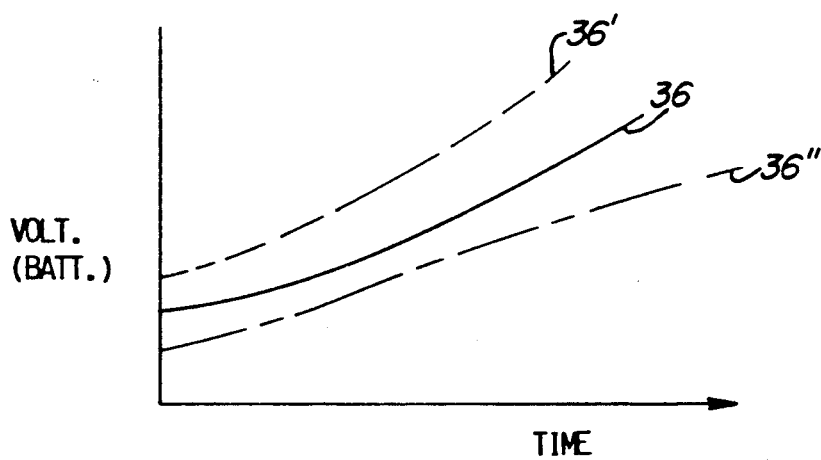
_Fig-4_
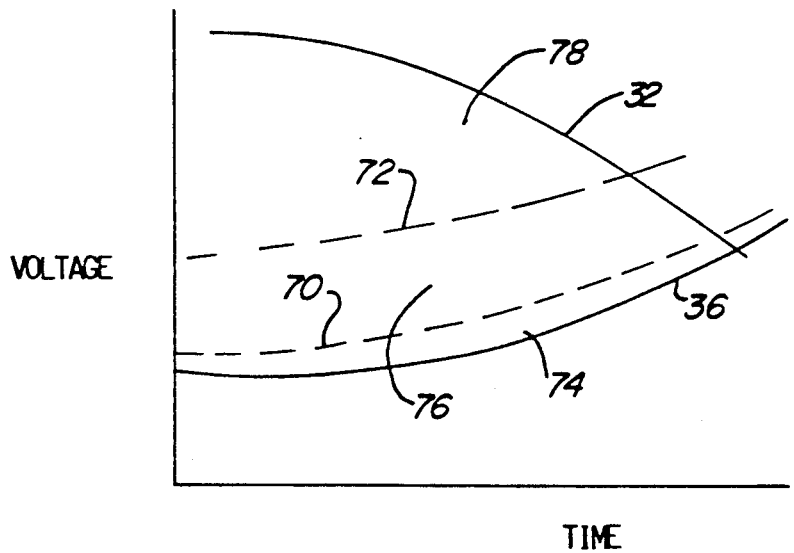
_Fig-6_
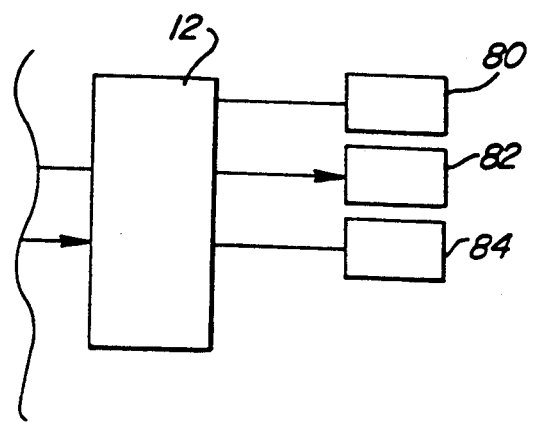
_Fig-7_

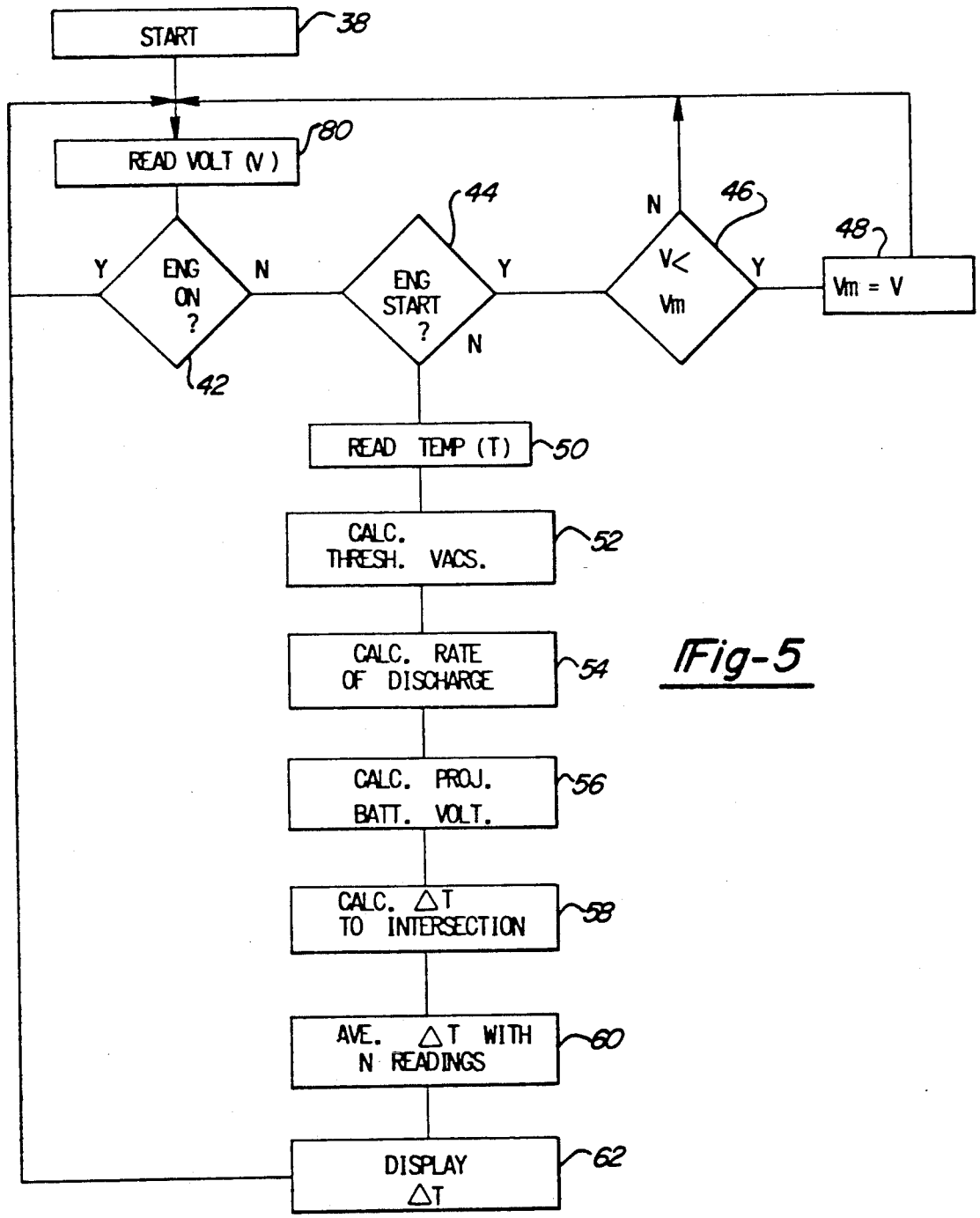

BATTERY MONITOR

CROSS REFERENCE TO RELATED APPLICATIONS

This application is a continuation-in-part patent application corresponding to U.S. Pat. Application Ser. No. 07/570,383, filed Aug. 21, 1990, entitled BATTERY MONITOR, now abandoned.

BACKGROUND OF THE INVENTION

I. Field of the Invention

The present invention relates to a battery monitoring device.

II. Description of the Prior Art

There are many previously known battery monitoring devices which measure and display the battery voltage. For example, such battery voltage indicators are commonly used in automobiles and other motor vehicles.

While these previously known battery monitoring devices are adequate for indicating the battery voltage, they are completely inadequate for indicating the remaining energy capacity of the battery. Furthermore, in many situations, such as the battery for a motor vehicle, it is desirable for the vehicle battery to retain sufficient charge to start the vehicle when required.

In motor vehicles it is oftentimes desirable to operate electrical accessories, such as the car radio, from the vehicle battery while the engine is turned off. In doing so, the battery becomes discharged. There are no battery indicators known to the Applicant, however, which provide an indication of the amount of time during which the battery discharge can be maintained and still retain sufficient charge in the battery to start the vehicle engine.

SUMMARY OF THE PRESENT INVENTION

The present invention provides a battery monitor which overcomes all of the above mentioned disadvantages of the previously known devices.

In brief, the battery monitor of the present invention comprises a microprocessor which iteratively reads a battery characteristic, such as the battery voltage, and then calculates the rate of discharge of the battery. The microprocessor, based upon the rate of discharge, then projects or extrapolates the battery voltage as a function of time.

Additionally, the microprocessor has a preprogrammed lower threshold value which varies as a function of time and temperature. Using the projected battery voltage as well as the lower threshold value, the microprocessor calculates the remaining time until the battery voltage reaches the threshold value and displays this projected time on an indicator, such as an LCD indicator. Consequently, the display time on the indicator represents the remaining time that the battery discharge can continue, at its present discharge rate, until the lower threshold value is attained. In the preferred embodiment of the invention, the lower threshold value represents the necessary energy capacity of the battery to start the vehicle so that the battery indicator provides a warning to the vehicle operator when the vehicle must be restarted in order to recharge the battery.

The battery monitor of the present invention preferably includes a temperature transducer which provides an electrical signal, representative of ambient battery temperature, to the microprocessor. The microprocessor then utilizes the ambient temperature of the battery to adjust the threshold value as a function of temperature. This in turn varies the projected time until the battery voltage attains the threshold value.

In a second preferred embodiment of the invention, the battery monitor of the present invention selectively illuminates two or more indicator lights to indicate both a full charge, medium charge and low charge battery condition.

BRIEF DESCRIPTION OF THE DRAWING

A better understanding of the present invention will be had upon reference to the following detailed description, when read in conjunction with the accompanying drawing, wherein like reference characters refer to like parts throughout the several views, and in which:

FIG. 1 is a block diagrammatic view illustrating a preferred embodiment of the present invention;

FIG. 2 is a graph illustrating the operation of the preferred embodiment of the present invention;

FIGS. 3 and 4 are further graphs illustrating a portion of the operation of the present invention;

FIG. 5 is a flow chart illustrating the preferred embodiment of the present invention;

FIG. 6 is a graph illustrating the operation of a second preferred embodiment of the present invention; and FIG. 7 is a fragmentary block diamgrammatic view illustrating a second preferred embodiment of the present invention.

DETAILED DESCRIPTION OF A PREFERRED EMBODIMENT OF THE PRESENT INVENTION

With reference first to FIG. 1, a block diagrammatic view of a preferred embodiment 10 of the battery monitor of the present invention is thereshown. The circuit 10 includes a microprocessor 12 which operates under control a computer program, preferably stored in read only memory (ROM) 14 contained on the microprocessor 12. Random access memory 16 is also accessible to the microprocessor 12 and may be either external to the microprocessor 12, as illustrated in FIG. 1, or contained internally on the microprocessor 12.

A battery 18 provides a voltage signal on line 20 to the microprocessor 12 as well as to an electrical system 22, such as the electrical system for a motor vehicle. A temperature transducer 24 also provides an output signal on its line 26 to the microprocessor 12 for a reason to be subsequently described.

Still referring to FIG. 1, an indicator 28, such as an LCD display, is connected to an output line 30 from the microprocessor 12. Consequently, as will become hereinafter apparent, the microprocessor 12 displays different values on the indicator 28 representative of the remaining time $T_R$ until the battery attains a predetermined capacity.

Alternatively or in addition, the microprocessor 12 may activate a warning signal 29, such as a warning light, when the remaining time $T_R$ is less than a preset time span, e.g. ten minutes.

With reference now to FIG. 2, the voltage of the battery 18 as a function of time is illustrated at 32 for a motor vehicle while the engine is off and during the state of battery discharge which would occur during the operation of an electrical accessory. Under these conditions, the battery voltage 32 decreases gradually from zero to the present or time $T_1$. The projected battery voltage, assuming continued battery drain at the same rate of discharge, is illustrated in phantom line 34 in FIG. 2.

A lower threshold voltage is illustrated at 36 in FIG. 2. This threshold voltage is determined by empirical testing and varies as a function of time and typically increases over time as shown in FIG. 2. The empirical testing data is preprogrammed in the microprocessor 12. Furthermore, this threshold voltage 36 is indicative of the minimum battery voltage necessary to start the vehicle engine through the starter circuit for the engine.

With reference now to FIGS. 2 and 5, a flow chart illustrating the operation of the computer program for the microprocessor 12 is illustrated in FIG. 5. The program starts at step 38 which then branches to step 40 at which time the microprocessor 12 reads the value (V) of the battery voltage. Step 40 then branches to step 42.

At step 42, the microprocessor 12 determines whether or not the engine is operating. If so, step 42 merely branches back to step 40 and the above process is repeated since, during engine operation, the battery 18 is in a state of charge, rather than discharge. Furthermore, although any conventional means can be utilized by the microprocessor 12 to determine whether or not the engine is operating, in a preferred embodiment of the invention, the microprocessor 12 detects the presence of electrical ignition noise on the input 20 which would be indicative of engine operation. Alternatively or in addition, a minimum battery voltage level, e.g. 13.6 volts, commonly indicative of an engine run condition, is used to determine whether or not the engine is operating.

Assuming that the engine is not operating, step 42 instead branches to step 44 in which the microprocessor determines whether or not an engine cranking or starting condition is in effect. If so, step 44 branches to step 46 which compares the present battery voltage V with the previously stored lowest battery voltage $V_m$ during engine cranking. If the present value V of the battery voltage is less than the previously stored value $V_m$, step 46 branches to step 48 which stores V as variable $V_m$ and returns to step 40. Otherwise, step 46 branches directly to step 40. The purpose of steps 46 and 48 will be subsequently described.

Assuming that the engine is not in an engine cranking condition, step 44 instead branches to step 50 where the microprocessor 12 reads the value of the temperature from the transducer 24 (FIG. 1) and stores this value as a variable (T).

Step 50 then branches to step 52 which calculates the threshold voltage 36 illustrated in FIG. 2. As best shown in FIG. 4, however, the threshold value 36 will vary somewhat as a function of temperature. For example, during a colder ambient temperature for the battery, the threshold value for the battery increases slightly as shown in phantom line at 36'. Conversely, when the ambient temperature of the battery is warmer, the threshold value for the battery 18 decreases as shown in the dash dot line 36".

After the threshold voltage for the battery 18 is calculated and projected at step 52, step 52 then branches to step 54.

At step 54, the microprocessor 18 calculates the rate of discharge of the battery and then branches to step 56 at which the microprocessor projects or extrapolates the future values of the battery voltage as shown in phantom line 34 in FIG. 2. The microprocessor uses any conventional curve extrapolation technique to project the voltage curve 34.

Step 56 then branches to step 58 at which the microprocessor calculates the time $T_2$ (FIG. 2) at which the projected battery voltage 34 intersects the threshold voltage 36 after the threshold voltage 36 is adjusted for temperature as illustrated in FIG. 4. Step 58 then calculates the projected time between the present time ($T_1$) and the intersection of the projected battery voltage 34 and threshold voltage 36 ($T_2$) and thus determines the remaining time $T_R$ between the times $T_1$ and $T_2$.

The time $T_R$ is thus representative of the remaining time under the current battery discharge conditions before the voltage of the battery 18 reaches the lower threshold value 36. Furthermore, since the lower threshold value 36 is representative of the minimum battery voltage necessary in order to start the vehicle engine when the battery 18 is used in an internal combustion motor vehicle, as the time $T_R$ approaches zero, it is indicative that the vehicle engine must be restarted in order to recharge the battery.

After step 58 calculates the time $T_R$, step 58 branches to step 60 which computes an average value for $T_R$ over a number N iterations of the computer program. Step 60 then branches to step 62 where the average value for $T_R$ is displayed on the indicator 28 (FIG. 1) and the above process is repeated.

With reference now to FIG. 3, FIG. 3 illustrates the voltage of the battery 18 during an engine cranking condition. During an engine cranking condition, the battery voltage typically drops dramatically, for example, to eight or nine volts, due to the large current drain. The lowest stored battery voltage $V_m$ obtained during an engine cranking condition is also indicative of the amount of energy necessary to start the vehicle. For example, a very low voltage $V_m$ is indicative that more energy is required to start the vehicle engine than a higher voltage $V_m$.

Consequently, as shown in FIG. 5 and previously described, steps 46 and 48 store the lowest voltage value $V_m$ during an engine cranking condition. Step 52 then adjusts the threshold value curve 36 upwards or downwards as a function of $V_m$ in a fashion similar to the adjustment for the temperature as shown in FIG. 4.

With reference now to FIGS. 6 and 7, an alternative embodiment of the present invention is thereshown. As best shown in FIG. 6, as before, the threshold value 36 of the minimum battery voltage necessary to start the engine is plotted as a function of time. As before, the threshold value 36 increases as a function of time and is preferably determined through empirical data. FIG. 6 also illustrates the battery voltage curve 32 as a function of time during a state of battery discharge.

In addition to the threshold value 36, however, the microprocessor also determines a threshold value 70 which tracks the threshold value 36 but is spaced upwardly from the threshold value 36 by a predetermined voltage, for example 0.2 volts. Similarly, a second threshold value 72 is also determined by the microprocessor and is spaced upwardly from the threshold value 36 by a second predetermined voltage, for example 1.2 volts.

Consequently, as can be clearly seen from FIG. 6, the threshold voltage at 36, 70 and 72 form at least two and preferably three zones 74, 76 and 78 of battery voltage. The zone 78, for example, would be indicative of a full or nearly full charge battery condition, the zone 76 be indicative of a medium charge battery condition and the zone 74 indicative of a low charge battery condition with respect to the battery capacity necessary for engine starting.

With reference now to FIG. 7, three indicator lights 80, 82 and 84 replace the indicator 28 illustrated in FIG. 1. The microprocessor 12, instead of calculating the amount of time until the battery voltage 32 crosses the lower threshold 36, instead determines whether the battery voltage level 32 is within the zone 78, the zone 76 or the zone 74. If the battery voltage level 32 is in the zone 78, the microprocessor 12 illuminates the indicator 80 which could, for example, be a green light. Similarly, when the battery voltage 32 enters the zone 76, the microprocessor instead illuminates the second indicator 82 which, for example, could comprise a yellow light. Similarly, when the battery voltage level 32 enters the low voltage zone 74, the microprocessor 12 illuminates the third indicator 84 which could, for example, comprise a red light.

Thus, the illumination of the green indicator 80 would be indicative that no unnecessary steps need be taken in order to conserve electrical energy from the battery. Conversely, illumination of the yellow indicator 82 would be indicative that electrical devices should be disconnected from the electrical system of the vehicle in order to conserve electrical energy. Lastly, illumination of the third indicator 84 would be indicative that it is necessary to immediately start the engine for the vehicle in order to recharge the battery.

From the foregoing, it can be seen that the present invention provides a battery monitor which indicates the remaining time until a predetermined lower threshold voltage is attained. Since the threshold value preferably represents the necessary voltage or battery capacity necessary to start the vehicle engine, the monitor of the present invention provides a warning to the operator of when it is necessary to either reduce the battery drain by discontinuing use of selected electrical accessories or to recharge the vehicle battery.

Although the present invention has been described for use with a motor vehicle having an internal combustion engine and its associated starter circuit, the battery monitor of the present invention is useful for other applications. For example, when used in conjunction with an electric vehicle, the indicator can indicate the remaining time until a predetermined lower threshold necessary to operate the electric vehicle at a minimal level is attained. The monitor can also be used for a solar powered battery system.

Having described my invention, however, many modifications thereto will become apparent to those skilled in the art to which it pertains without deviation from the spirit of the invention as defined by the scope of the appended claims.

I claim:
1. For use in conjunction with a battery electrically connected with a starter circuit for an internal combustion engine, a battery monitor comprising:
   means for sensing an electrical characteristic of the battery,
   means responsive to said sensing means for determining the rate of discharge of the battery and for projecting future values of said electrical characteristic as a function of time,
   means for establishing a predetermined lower threshold value of said characteristic, said threshold value varying as a function of time, said lower threshold value indicative of the energy capacity of the battery necessary to start the engine through the starter circuit,
   means for determining the projected time at which said projected future value of said electrical characteristic equals said threshold value and for determining a remaining time duration between a present time and said projected time, and
   means for displaying said remaining time duration.

2. The invention as defined in claim 1 wherein said battery electrical characteristic is the battery voltage.

3. The invention as defined in claim 1 wherein said indicator periodically determines said time duration and further comprising means for calculating an average time duration, and wherein said displaying means displays said average time duration.

4. The invention as defined in claim 1 and further comprising means for determining an ambient temperature of said battery, and means responsive to said temperature determining means for varying said lower threshold value.

5. The invention as defined in claim 1 wherein said battery is electrically connected with a starter circuit for an internal combustion engine and wherein said lower threshold value is indicative of the energy capacity of the battery necessary to start the engine through the starter circuit.

6. The invention as defined in claim 5 and comprising means for detecting and saving a minimum battery voltage during an engine starting condition and means for varying said lower threshold value as a function of said minimum battery voltage.

7. The invention as defined in claim 1 wherein said determining means comprises a microprocessor.

8. The invention as defined in claim 1 wherein said displaying means comprises a liquid crystal display.

9. For use in conjunction with a battery, a battery monitor comprising:
   means or sensing an electrical characteristic of the battery,
   means responsive to said sensing means for determining the rate of discharge of the battery and for projecting the future values of the electrical characteristic as a function of time,
   means for establishing a predetermined lower threshold value of said characteristic, said threshold value varying as a function of time,
   means for determining the projected time at which the electrical characteristic equals said threshold value at said projected time and for determining the time duration until said projected time, and
   means for comparing said time duration with a preset time span,
   an indicator, and
   means responsive to said comparing means for activating said indicator when said time duration is less than said time span.

10. The invention as defined in claim 9 wherein said battery electrical characteristic is the battery voltage.

11. The invention as defined in claim 9 and further comprising means for determining an ambient temperature of said battery, and means responsive to said temperature determining means for varying said threshold value.

12. The invention as defined in claim 9 wherein said battery is electrically connected with a starter circuit for an internal combustion engine and wherein said lower threshold value is indicative of the energy capacity of the battery necessary to start the engine through the starter circuit.

13. The invention as defined in claim 12 and comprising means for detecting and saving a minimum battery voltage during an engine starting condition and means for varying said lower threshold value as a function of said minimum battery voltage.

14. The invention as defined in claim 9 wherein said determining means comprises a microprocessor.

15. For use in conjunction with a battery, a battery monitor comprising:
   means for sensing an electrical characteristic of the battery to generate an output signal representative thereof,
   means for establishing a first predetermined lower threshold value of said characteristic, said first threshold value varying as a function of time,
   means for establishing a second threshold value, said second threshold value exceeding said first threshold value by a preset amount,
   means for comparing said output signal with said threshold values to determine which of said threshold values of said characteristic is appropriate,
   a first and a second indicator,
   means for activating said first indicator when said output signal exceeds said second threshold value, and
   means for activating said second indicator instead of said first indicator when said output signal is less than said second threshold value.

16. The invention as defined in claim 15 and comprising means for establishing a third threshold value which exceeds said second threshold value by a second preset amount, a third indicator, and means for activating said third indicator when said output signal exceeds said third threshold value, and
   wherein said means for activating said second indicator activates said second indicator only when said output signal is between said second and third threshold values.

17. The invention as defined in claim 15 wherein said indicators comprise lights.

18. The invention as defined in claim 15 wherein said battery electrical characteristic is the battery voltage.

19. The invention as defined in claim 15, and further comprising means for determining an ambient temperature of said battery, and means responsive to said temperature determining means for varying said lower threshold value.

20. The invention as defined in claim 15 wherein said battery is electrically connected with a starter circuit for an internal combustion engine and wherein said lower threshold value is indicative of the energy capacity of the battery necessary to start the engine through the starter circuit.

21. The invention as defined in claim 20 and comprising means for detecting and saving a minimum battery voltage during an engine starting condition and means for varying said lower threshold value as a function of said minimum battery voltage.

* * * * *